US008258851B2

(12) United States Patent
Miyazawa

(10) Patent No.: US 8,258,851 B2
(45) Date of Patent: Sep. 4, 2012

(54) SWITCHING CIRCUIT AND METHOD FOR TESTING THE SAME

(75) Inventor: Naoyuki Miyazawa, Kanagawa (JP)

(73) Assignee: Sumitomo Electric Device Innovations, Inc., Yokohama, Kanagawa (JP)

(*) Notice: Subject to any disclaimer, the term of this patent is extended or adjusted under 35 U.S.C. 154(b) by 235 days.

(21) Appl. No.: 12/720,254

(22) Filed: Mar. 9, 2010

(65) Prior Publication Data

US 2010/0237928 A1 Sep. 23, 2010

(30) Foreign Application Priority Data

Mar. 18, 2009 (JP) .................................. 2009-065458

(51) Int. Cl.
*H03K 17/00* (2006.01)
(52) U.S. Cl. .......................... 327/365; 327/376; 327/377
(58) Field of Classification Search .................. 327/374, 327/472, 365, 376, 377, 427
See application file for complete search history.

(56) References Cited

U.S. PATENT DOCUMENTS

| 5,903,178 | A | * | 5/1999 | Miyatsuji et al. | 327/308 |
| 5,936,291 | A | * | 8/1999 | Makita et al. | 257/405 |
| 6,118,985 | A | * | 9/2000 | Kawakyu et al. | 455/78 |
| 6,700,433 | B2 | * | 3/2004 | Zuk | 327/427 |
| 6,873,200 | B2 | * | 3/2005 | Evers et al. | 327/365 |
| 6,900,688 | B2 | * | 5/2005 | Tomari et al. | 327/534 |
| 7,924,085 | B2 | * | 4/2011 | Guo | 327/534 |

FOREIGN PATENT DOCUMENTS

JP 2006-135666 A 5/2006

* cited by examiner

*Primary Examiner* — Hai L Nguyen
(74) *Attorney, Agent, or Firm* — Westerman, Hattori, Daniels & Adrian, LLP

(57) ABSTRACT

There is provided a method for testing a switching circuit including a first FET connected between input/output terminals, a capacitor connected between one of the input/output terminals and the first FET, and a second FET that is connected in parallel with the capacitor and has a gate electrode connected to a ground terminal. The method includes, applying a potential that sets the second FET to a conducting state to the ground terminal, and testing a DC test for the first FET via the second FET.

5 Claims, 7 Drawing Sheets

PRIOR ART

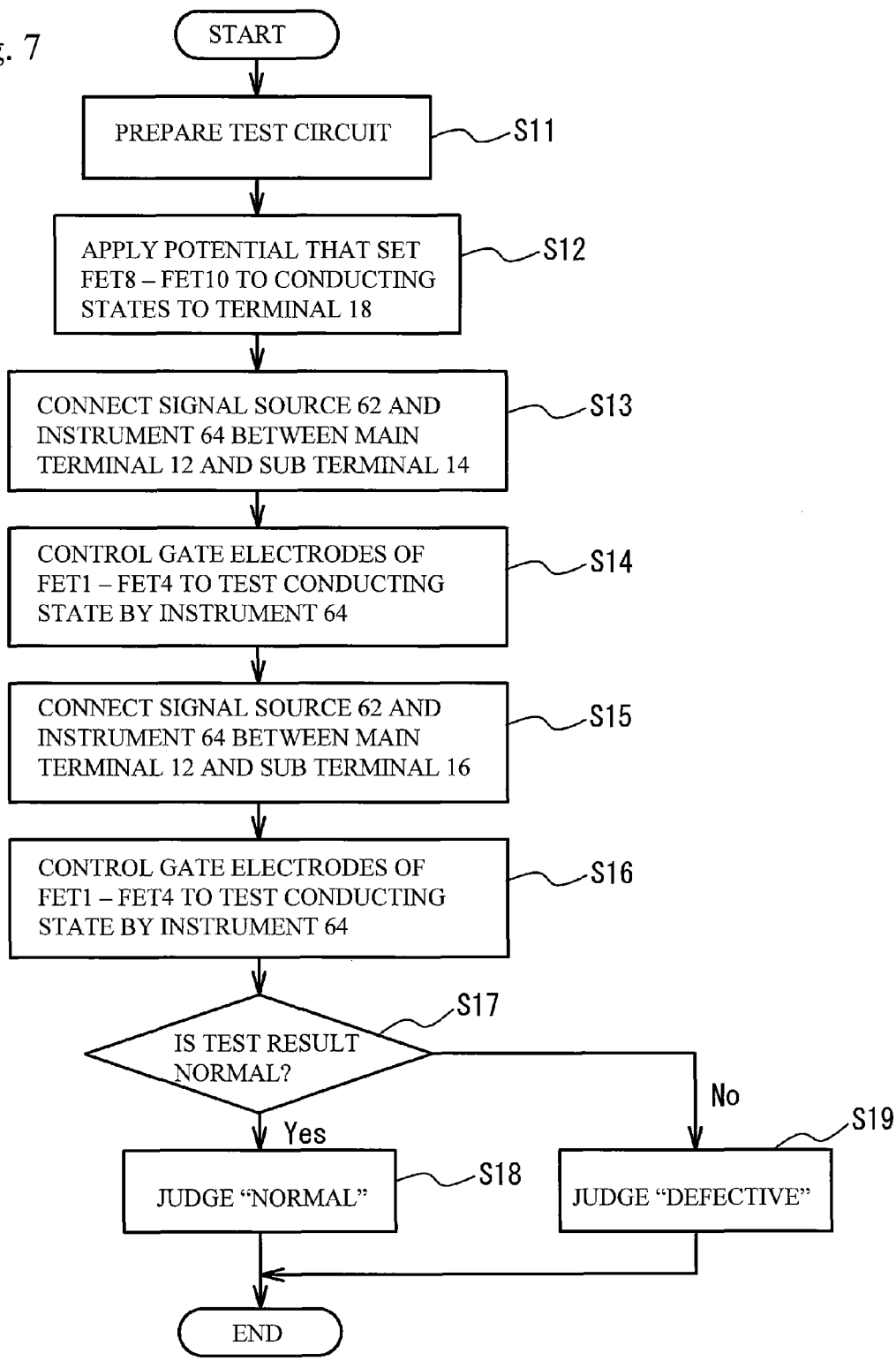

SWITCHING CIRCUIT AND METHOD FOR TESTING THE SAME

CROSS-REFERENCE TO RELATED APPLICATION

This application is based upon and claims the benefit of priority of the prior Japanese Patent Application No. 2009-065458, filed on Mar. 18, 2009, the entire contents of which are incorporated herein by reference.

BACKGROUND (i) Technical Field

The present invention relates to a switching circuit and a method for testing the same.

(ii) Related Art

Devices that handle RF signals such as portable phones employ a switching circuit that switches a path of RF signals. The operation of the switching circuit may be tested by connecting an RF signal source to an input/output terminal and confirming the conducting state of the switch circuit and the isolation between circuits connected to the switching circuit.

Japanese Patent Application Publication No. 2006-135666 discloses a compact and less-expensive switching circuit, and a switching module and a semiconductor device using the switching circuit.

However, the RF signal source is expensive, and the test for the operation of the switching circuit that controls the RF signal is thus expensive.

SUMMARY OF THE INVENTION

The present invention has been made in view of the above-described circumstances.

According to an aspect of the present invention, there is provided a method for testing a switching circuit including a first FET connected between input/output terminals, a capacitor connected between one of the input/output terminals and the first FET, and a second FET that is connected in parallel with the capacitor and has a gate electrode connected to a ground terminal, the method including: applying a potential that sets the second FET to a conducting state to the ground terminal; and testing a DC test for the first FET via the second FET.

BRIEF DESCRIPTION OF THE DRAWINGS

FIG. 7 is a flowchart of a sequence of testing the operation of the switching circuit in accordance with the second embodiment.

DETAILED DESCRIPTION

Now, a first comparative example is described in comparison with embodiments of the present invention.

Figure 1:
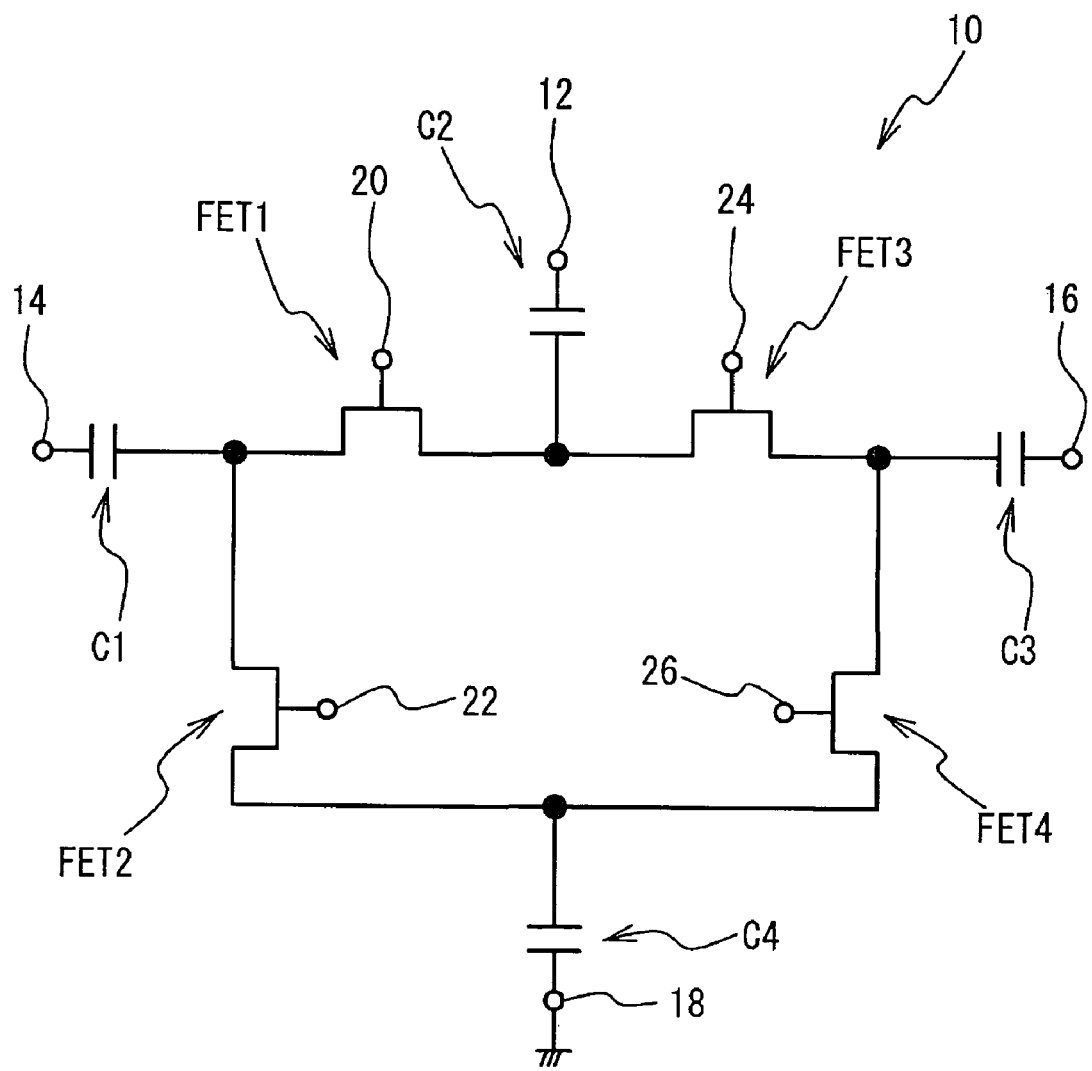
FIG. 1 is a circuit diagram of a switching circuit in accordance with a first comparative example.

FIG. 1 is a circuit diagram of a switching circuit 10 in accordance with the first comparative example. The switching circuit 10 switches paths of RF signals when the switching circuit 10 is normally used. Referring to FIG. 1, the switching circuit 10 has multiple input/output terminals 12, 14 and 16, a ground terminal 18, field effect transistors FET1 through FET4, and capacitors C1 through C4. The input/output terminal 12 is a main input/output terminal, and the input/output terminals 14 and 16 are sub input/output terminals. The source electrode of the transistor FET1 is connected to the main input/output terminal 12, and the drain electrode thereof is connected to the sub input/output terminal 14. The source electrode of the transistor FET3 is connected to the main input/output terminal 12, and the drain electrode thereof is connected to the sub input/output terminal 16. The source electrode of the transistor FET2 is connected to the ground terminal 18, and the drain electrode thereof is connected to the sub input/output terminal 14. The source electrode of the transistor FET4 is connected to the ground terminal 18, and the drain electrode thereof is connected to the sub input/output terminal 16. The capacitor C2 is connected between the main input/output terminal 12 and the transistors FET1 and FET3. The capacitor C1 is connected between the sub input/output terminal 14 and the transistor FET1, and the capacitor C3 is connected between the sub input/output terminal 16 and the transistor FET3. The capacitor C4 is connected between the ground terminal 18 and the transistors FET2 and FET4.

The switching circuit 10 is of SPDT (Single Pole Double Throw) type. Circuits may be connected to the main input/output terminal 12 and the sub input/output terminals 14 and 16. For example, in a case where the switching circuit 10 is employed in a portable phone, the main input/output terminal 12 may be connected to an antenna, and the sub input/output terminals 14 and 16 may be connected to a transmitter circuit and a receiver circuit, respectively. The ground terminal 18 is connected, as illustrated in FIG. 1. One of the sub input/output terminals 14 and 16 is selected and the other is grounded, so that the antenna can be connected to the circuit connected to the selected one of the sub input/output terminals 14 and 16. Simultaneously, the antenna may be cut off from the circuit connected to the other one of the sub input/output terminals 14 and 16. It is thus possible for the transmitter circuit and the receiver circuit to share the antenna connected to the main input/output terminal 12.

The transistors FET1 and FET3 are used for switching between the input/output terminal 12 and the paths connected to the sub input/output terminals 14 and 16. The transistors FET2 and FET4 are shunt transistors, and are used to ground the other one of the sub input/output terminals 14 and 16. The transistors FET1 through FET4 may be switched between the conducting states and the cutoff states by switching control signals applied to the gate electrodes 20, 22, 24 and 26. The path between the main input/output terminal 12 and the sub input/output terminal 14 may be established, while the main input/output terminal 12 and the sub input/output terminal 16 are cutoff, by setting the transistors FET1 and FET4 to the conducting states, and setting the transistors FET2 and FET3 to the cutoff states. In contrast, the path between the main input/output terminal 12 and the sub input/output terminal 16 may be established, while the main input/output terminal 12 and the sub input/output terminal 14 are cutoff, by setting the transistors FET2 and FET3 to the conducting states, and setting the transistors FET1 and FET4 to the cutoff states. It is thus possible to enhance the isolation between the main input/output terminal 12 and the sub input/output terminal 16 when the path between the main input/output terminal 12 and the sub input/output terminal 14 is formed and to enhance the isolation between the main input/output terminal 12 and the sub input/output terminal 14 when the path between the main input/output terminal 12 and the sub input/output terminal 16 is formed.

When the switching circuit is normally used, only the RF signal flows through the capacitors C1, C2 and C3. The capacitors C1, C2 and C3 disconnect the switching circuit 10 from the external circuits in the DC operation. Thus, the capacitors C1, C2 and C3 function to stabilize the operation of the switching circuit 10.

Since the switching circuit 10 includes the capacitors C1, C2 and C3 that cut off the DC component, a less-expensive DC signal source cannot be used in the operation test. Thus, an expensive RF signal source is used. This increases the cost of the operation test for the switching circuit 10.

First Embodiment

A first embodiment of the present invention is a less-expensive method for testing the switching circuit without using the RF signal source.

Figure 2:
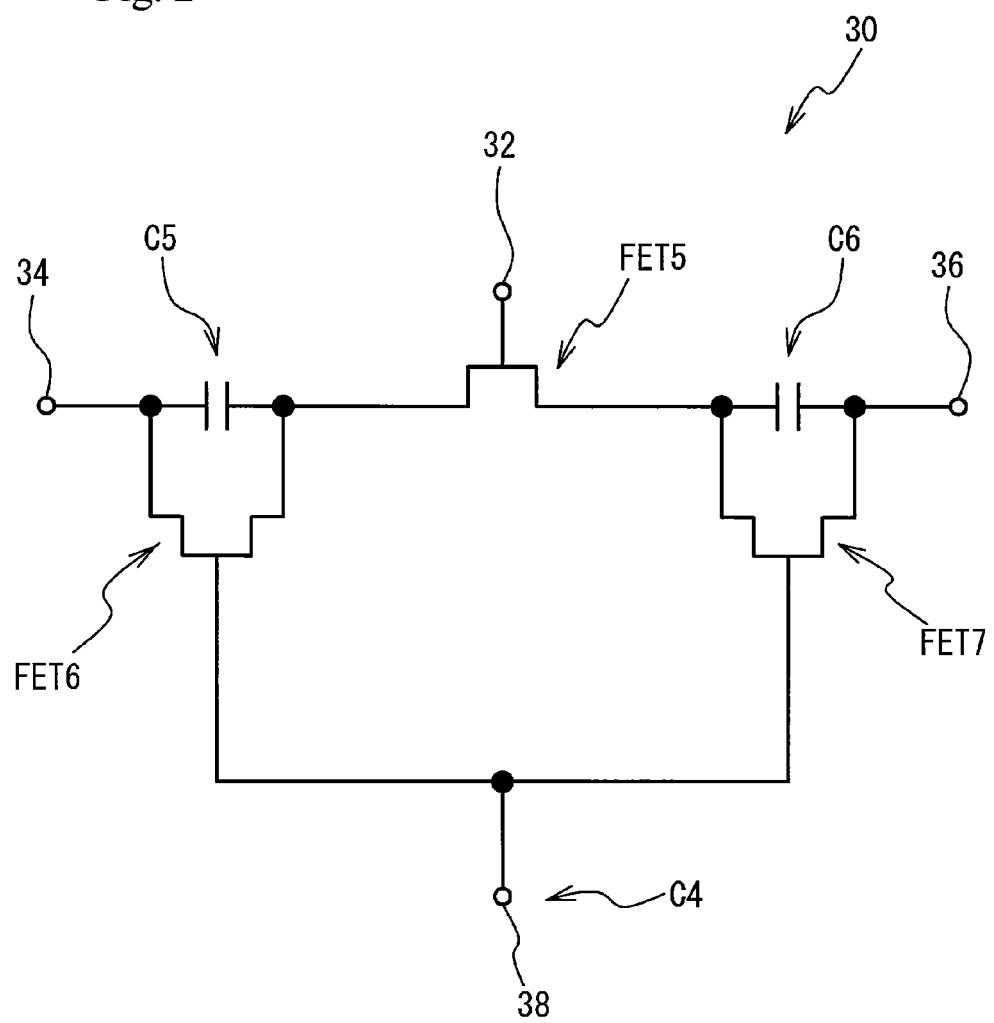
FIG. 2 is a circuit diagram of a switching circuit in accordance with a first embodiment.

FIG. 2 is a circuit diagram of a switching circuit 30 in accordance with a first embodiment. The switching circuit 30 switches paths of RF signals when the switching circuit 30 is normally used. Referring to FIG. 2, the switching circuit 30 is of SPST (Single Port Single Throw) type and is composed of a field effect transistor FET5 for use in switching between an input/output terminal 34 and an input/output terminal 36. The transistor FET5, which may be defined as a first FET, may be provided between the input/output terminals 34 and 36. A capacitor C5 is connected between the transistor FET5 and the input/output terminal 34, and a capacitor C6 is connected between the transistor FET5 and the input/output terminal 36. Transistors FET6 and FET7, which may be defined as second FETs, are connected in parallel with the capacitors C5 and C6, respectively, and form paths for bypassing the capacitors C5 and C6. The gate electrodes of the transistors FET6 and FET7 are directly connected in series to a ground terminal 38. The ground terminal 38 is grounded in normal use. The transistor FET5 selectively establishes the path between the input/output terminals 34 and 36 in response to the control signal applied to a gate electrode 32 of the transistor FET5. The input/output terminal 34 and the source electrode of the transistor FET6 are connected. The drain electrode of the transistor FET6 and the source electrode of the transistor FET5 are connected. The drain electrode of the transistor FET5 and the source electrode of the transistor FET7 are connected. The drain electrode of the transistor FET7 and the input/output terminal 36 are connected. The transistor FET5 is a MESFET (Metal Semiconductor Field Effect Transistor) of depletion type, and the transistors FET6 and FET7 are MESFETs of enhancement type. The transistors FET5, FET6 and FET7 have a gate width of, for example, 0.5 mm. The capacitors C5 and C6 have a capacitance of, for example, 5 pF.

In a case where the operation test for the switching circuit 30 is carried out using the DC signal source, the transistors FET6 and FET7 are switched to the conducting states. Thus, the passes that bypass the capacitors C5 and C6 are established by the transistors FET6 and FET7, respectively. In the normal use in which the switching circuit 30 handles the RF signals, the ground potential is applied to the gate electrodes of the transistors FET6 and FET7 via the ground terminal 38, so that the transistors FET6 and FET7 are cut off. Thus, the paths that bypass the capacitors C5 and C6 are switched to the cutoff states. It is thus possible to prevent the transistors FET6 and FET7 from affecting the RF signals in the normal use in which the switching circuit 30 handles the RF signals.

Figure 3:
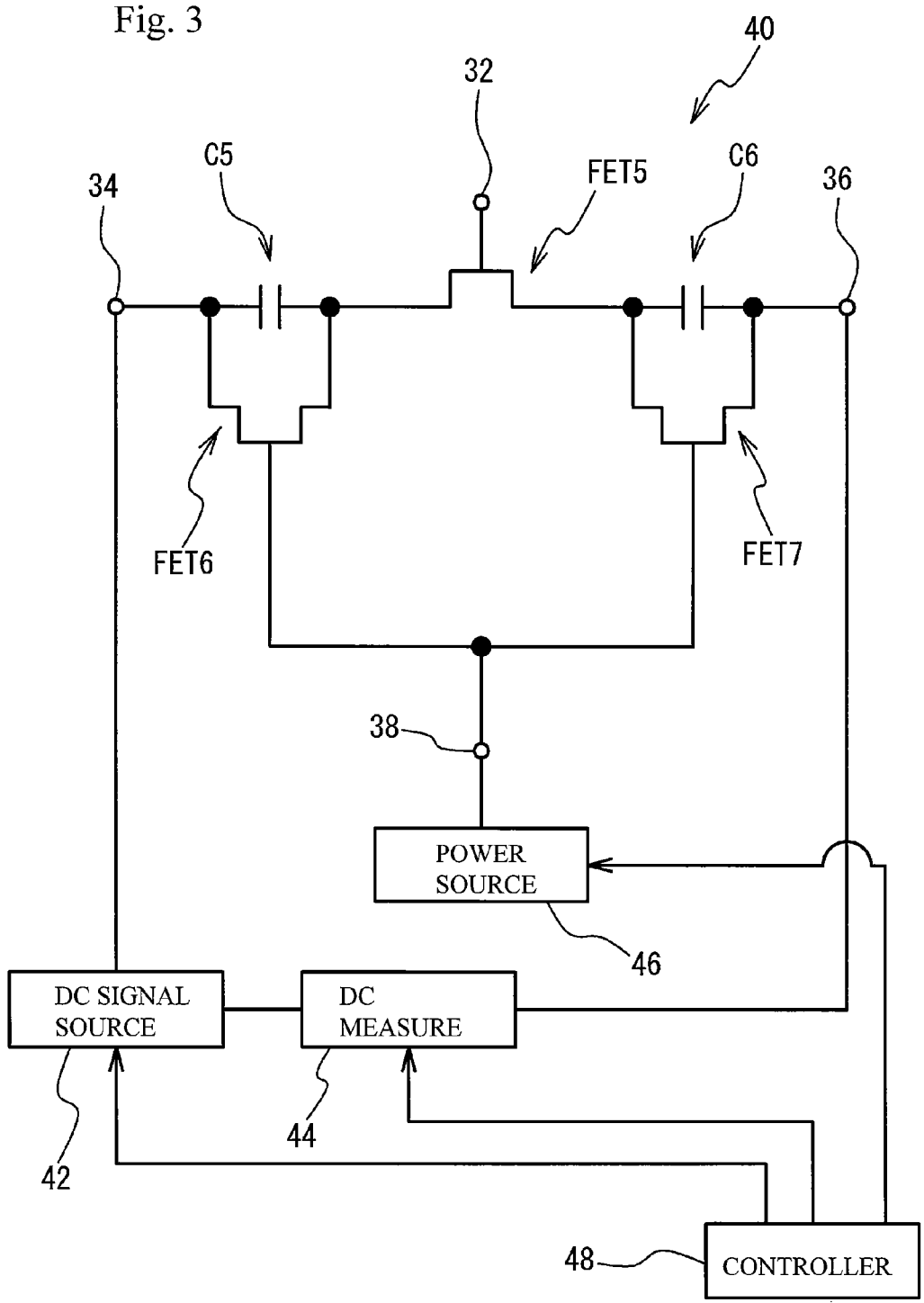
FIG. 3 is a circuit diagram of a circuit for testing the operation of the switching circuit in accordance with the first embodiment.

A description will now be given of a configuration of a circuit for testing the operation of the switching circuit 30. FIG. 3 is a circuit diagram of an exemplary circuit for testing the operation of the switching circuit 30. In FIG. 3, parts that are the same as those illustrated in FIG. 2 are given the same reference numerals.

Referring to FIG. 3, the test circuit is composed of a DC signal source 42, a DC measuring instrument 44, a control power source 46, and a controller 48. The DC signal source 42 is connected between the input/output terminal 34 and the input/output terminal 36, and applies a DC signal to the switching circuit 30. The DC measuring instrument 44 is connected between the input/output terminal 34 and the input/output terminal 36, and measures the current that flows through the switching circuit 30. The control power source 46 is connected to the ground terminal 38, and applies a potential that sets the transistors FET6 and FET7 to the conducting states to the ground terminal 38. The controller 48 controls the DC signal source 42, the DC measuring instrument 44 and the control power source 46.

Figure 4:
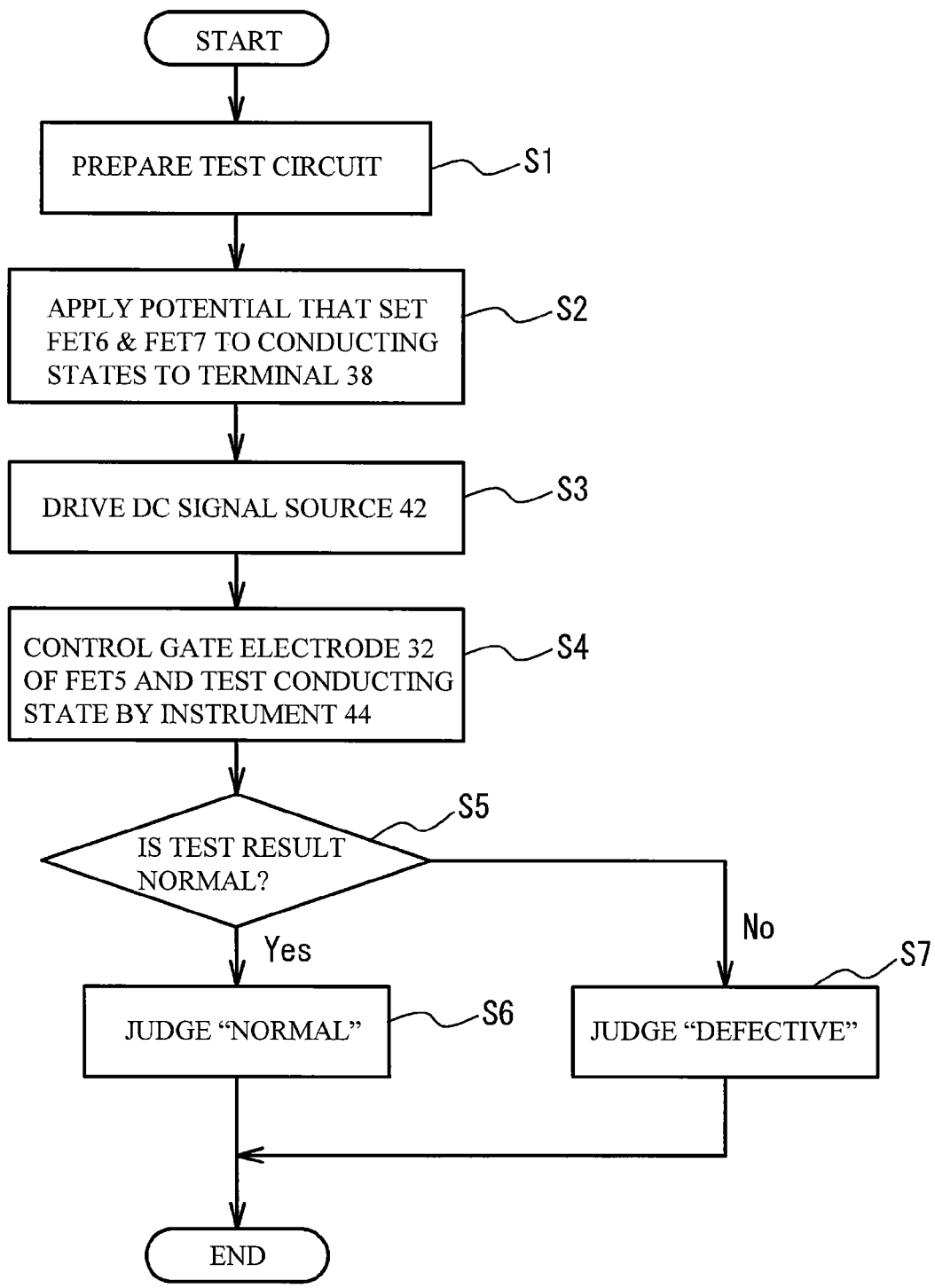
FIG. 4 is a flowchart of a sequence of testing the operation of the switching circuit in accordance with the first embodiment.

A description will now be given of a sequence of testing the operation of the switching circuit 30. FIG. 4 is a flowchart of an exemplary sequence of testing the operation of the switching circuit 30. Referring to FIG. 4, the circuit for testing the operation of the switching circuit 30 is prepared (step S1). The controller 48 controls the control power source 46 to apply the potential (equal to, for example, 3V) that switches the transistors FET6 and FET7 to the conducting states to the ground terminal 38 (step S2). Step S2 establishes the pass that allows the DC signal to flow while bypassing the capacitors C5 and C6. The controller 48 drives the DC signal source 42 (step S3). Thus, potential difference (for example, 0.4 V) is defined between the input/output terminal 34 and the input/output terminal 36. The controller 48 controls the gate electrode 32 so as to set the transistor FET5 to the conducting state, and the DC measuring instrument 44 measures the current for testing the conducting state of the switching circuit 30 (step S4). For example, when the ON-state resistance value of the transistor FET5 is 10Ω, and the applied potential is 0.4 V at step S4, the current value measured is 40 mA (=0.4 V/10Ω).

The controller 48 determines whether the current value measured at step S4 is within a predetermined range, and judges whether the measurement result is normal (step S5). If it is judged that the measurement result is normal (Yes at step S5), the controller 48 judges that the switching circuit 30 is normal (step S6). If it is judged that the measurement result is not normal, the controller 48 judges that the switching circuit 30 is defective (step S7). Then, the operation test ends.

The method for testing the operation of the switching circuit 30 in accordance with the first embodiment is configured to apply the potential that switches the transistors FET6 and FET7 to the conducting states to the ground terminal 38 (step S2). Thus, the pass in which the current flows while bypassing the capacitors C5 and C6 is established. The controller 48 applies the DC current to the transistor FET5 via the path that is formed by the transistors FET6 and FET7 so as to bypass the capacitors C5 and C6. The transistor FET5 is switched by the gate electrode 32 (step S4). Then, the DC test for the transistor FET5 is carried out. It is thus possible to test the operation of the switching circuit 30 that handles the RF signal by using the DC signal source and the DC measuring instrument that are less expensive than the RF signal source.

In the first embodiment, the switching circuit 30 is configured to have the capacitor C5 connected between the input/output terminal 34 and the transistor FET5 serving as the first FET and the capacitor C6 connected between the input/output terminal 36 and the transistor FET5. The above circuit configuration may be varied so that the capacitor is connected between at least one of the multiple input/output terminals and the first FET. For example, the switching circuit 30 may be varied so that only one of the capacitors C5 and C6 is employed.

In the first embodiment, the transistors FET6 and FET7 serving as the second FETs are in the cutoff states in the case where the gate electrodes of the second FETs are set at the ground potential. It is possible to prevent the second FETS from affecting the RF signals by setting the second FETs to the cutoff states in the normal use in which the switching circuit 30 handles the RF signals.

The second FETs of the transistors FET6 and FET7 used in the first embodiment are of enhancement type. It is preferable that the second FETs are in the cutoff states in the state in which the gate electrodes, are set at the ground potential and are in the conducting states in the operation test. Thus, the second FETs are preferably enhancement-type FETs.

In the first embodiment, the transistors FET6 and FET7 are connected to the ground terminal 38. Generally, a ground terminal that should be set at the ground potential is attached to a package on which a chip of the switching circuit is mounted. The ground terminal of the package may be shared with the ground terminal to which the second FETs are connected. Thus, the use of the second FETs does not increase the cost of testing.

The second FETs employed in the first embodiment are not limited to MESFETs but may be HEMT (High Electron Mobility Transistor) or MOSFET (Metal Oxide Semiconductor Field Effect Transistor).

In the above-described circuit, the drain and source electrodes of the transistors FET 5 through FET7 may be interchanged.

Second Embodiment

A description will now be given of a second embodiment of the less-expensive method for testing the operation of the switching circuit that controls the RF signals without using the RF signal source.

Figure 5:
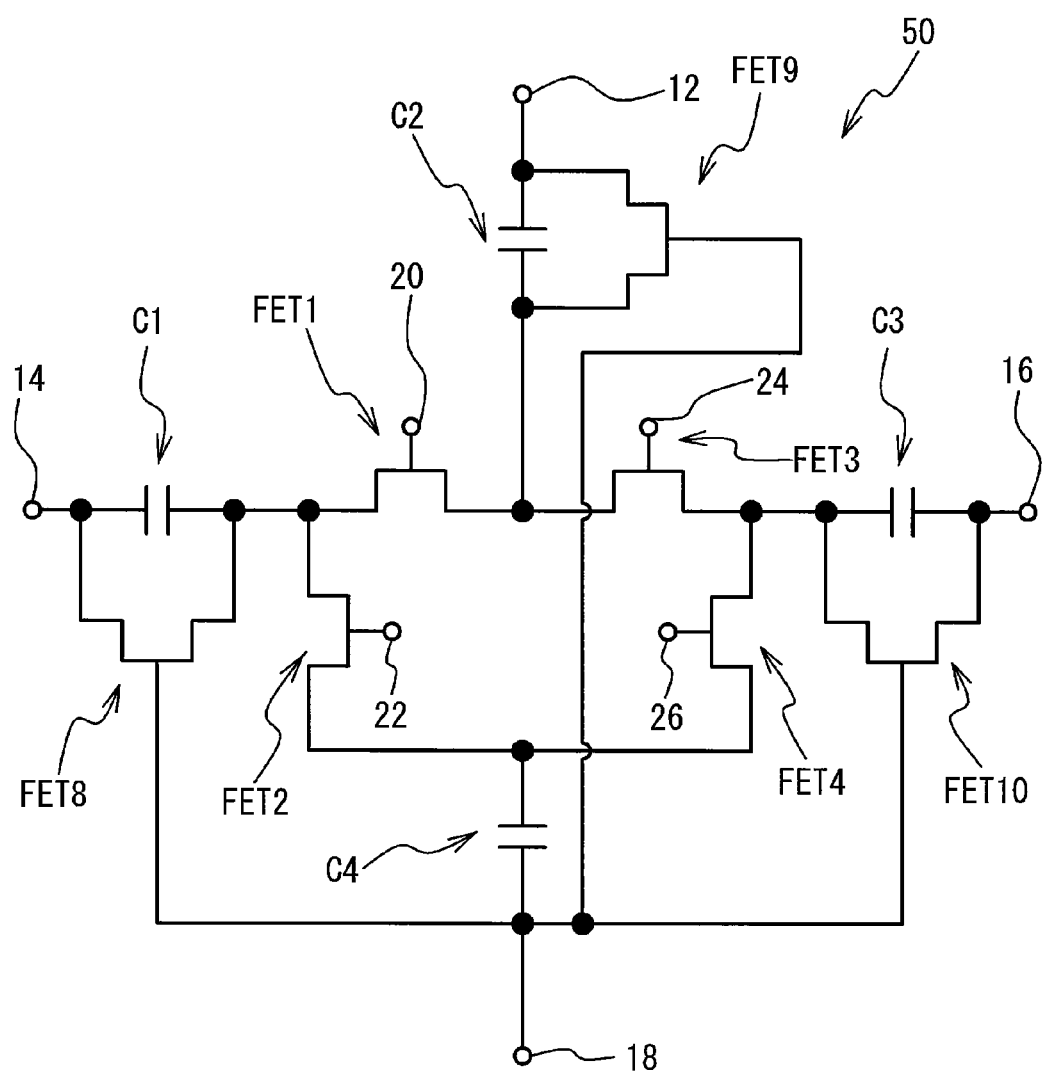
FIG. 5 is a circuit diagram of a switching circuit in accordance with a second embodiment.

FIG. 5 is a circuit diagram of a switching circuit 50 in accordance with the second embodiment. In FIG. 5, parts that are the same as those illustrated in FIG. 1 are given the same reference numerals.

Referring to FIG. 5, transistors FET8, FET9 and FET10, which may be defined as second FETs, are connected in parallel with the capacitors C1, C2 and C3, respectively, and form paths that bypass the respective capacitors. The gate electrodes of the transistors FET8, FET9 and FET10 are connected to the ground terminal 18. The drain electrode of the transistor FET9 is connected to the source electrodes of the transistors FET1 and FET3, and the source electrode of the transistor FET9 is connected to the main input/output terminal 12. The drain electrode of the transistor FET8 is connected to the sub input/output terminal 14, and the source electrode of the transistor FET8 is connected to the drain electrode of the transistor FET1. The source electrode of the transistor FET10 is connected to the drain electrode of the transistor FET3, and the drain electrode of the transistor FET10 is connected to the sub input/output terminal 16. The transistors FET1, FET2, FET3 and FET4 are MESFETs of depletion type, and the transistors FET8, FET9 and FET10 are of MESFETs of enhancement type.

When the operation of the switching circuit 50 is tested with the DC signal source, the transistors FET8, FET9 and FET10 are set to the conducting states, as will be described later. Thus, the paths that bypass the capacitors C1, C2 and C3 are established by the transistors FET8, FET9 and FET10, respectively. In the normal use in which the switching circuit 50 handles the RF signals, the transistors FET8, FET9 and FET10 are switched to the cutoff states by applying the ground potential to the gates of these transistors via the ground terminal 18. Thus, the paths that bypass the capacitors C1, C2 and C3 are cut off by the transistors FET8, FET9 and FET10. It is thus possible to prevent the transistors FET8, FET9 and FET10 from affecting the RF signals in the normal use in which the switching circuit 50 handles the RF signals.

Figure 6:
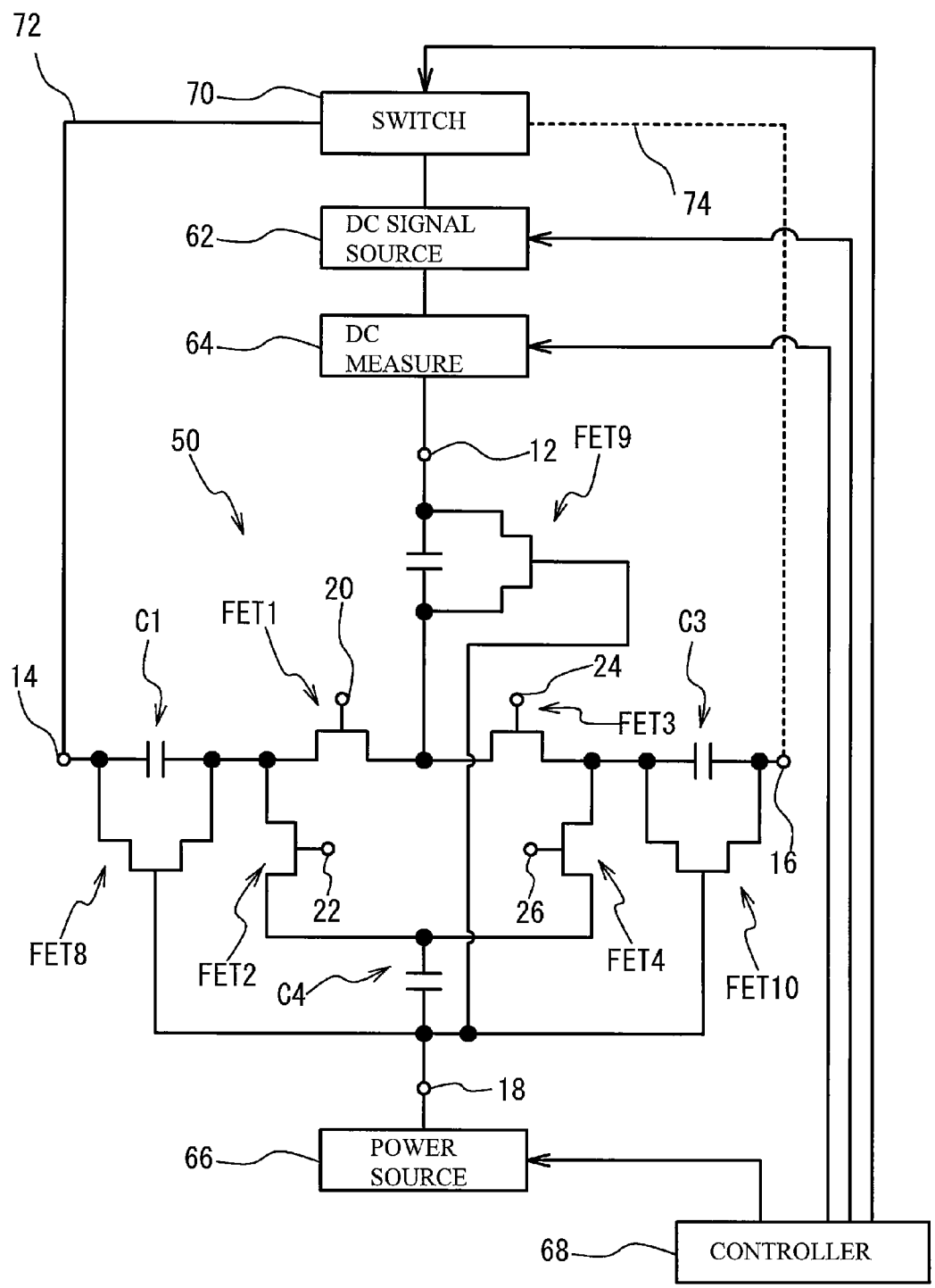
FIG. 6 is a circuit diagram of a circuit for testing the operation of the switching circuit in accordance with the second embodiment.

An exemplary configuration of the circuit for testing the operation of the switching circuit 50 is now described. FIG. 6 is a circuit diagram of an exemplary configuration of the circuit for testing the operation of the switching circuit 50. In FIG. 6, parts that are the same as those illustrated in FIG. 5 are given the same reference numerals.

Referring to FIG. 6, the circuit for testing the operation of the switching circuit 50 has a DC signal source 62, a DC measuring instrument 64, a control power source 66, a controller 68, and a switch 70. The DC signal source 62 applies a DC signal to the switching circuit 50. The DC measuring instrument 64 measures current that flows through the switching circuit 50. The DC signal source 62 and the DC measuring instrument 64 are connected between the main input/output terminal 12 and one of the sub input/output terminals 14 and 16. The switch 70 selects one of the sub input/output terminals 14 and 16. When the main input/output terminal 12 and the sub input/output terminal 14 are connected, the switch 70 and the sub input/output terminal 14 are connected as illustrated by a solid line 72 in FIG. 6. When the main input/output terminal 12 and the sub input/output terminal 16 are connected, the switch 70 and the sub input/output terminal 14 are connected as illustrated by a solid broken line 74. The control power source 66 is connected to the ground terminal 18, and applies a potential that sets the transistors FET8, FET9 and FET10 to the conducting states to the ground terminal 18. The controller 68 controls the DC signal source 62, the DC measuring instrument 64, the control power source 66 and the switch 70.

The capacitor C4 is connected between the ground terminal 18 and the transistor FET2, which may be defined by a third FET, and is connected between the ground terminal 18 and the transistor FET4, which may be defined by another third FET. The transistor FET2 is connected between the sub input/output terminal 14 and the ground terminal 18, and the transistor FET4 is connected between the sub input/output terminal 16 and the ground terminal 18. In the normal use of the switching circuit 50, the ground terminal 18 is grounded, and the transistors FET8, FET9 and FET10 are thus cut off. In this state, the transistors FET2 and FET4 are grounded via the capacitor C4 at frequencies of RF signals. In the test for the operation of the switching circuit 50, the ground terminal 18 is connected to the control power source 66 to set the transistors FET8, FET9 and FET10 to the conducting states and allow the DC signal to flow. In this case, the capacitor C4 cuts off the DC signal, and the transistors FET2 and FET4 are not grounded in the DC operation. It is thus possible to share the terminal for grounding the transistors FET2 and FET4 at the frequencies of RF signals in the normal use of the switching circuit 50 and the terminal for making a connection with the control power source 66 that applies the potential that sets the transistors FET8, FET9 and FET10 in the conducting states in the operation test for the switching circuit 50. Thus, the number of terminals can be reduced.

The sequence of the operation test for the switching circuit 50 is now described. FIG. 7 is a flowchart of a sequence of testing the operation of the switching circuit 50. Referring to FIGS. 6 and 7, the circuit for testing the operation of the switching circuit 50 is prepared (step S11). The controller 68 controls the control power source 66 to apply the potential (equal to, for example, 3V) that switches the transistors FET8, FET9 and FET10 to the conducting states to the ground terminal 18 (step S12). Step S12 establishes the pass that allows the DC signal to flow while bypassing the capacitors C1, C2 and C3. The controller 68 controls the switch 70 to connect the DC signal source 62 and the DC measuring instrument 64 between the main input/output terminal 12 and the sub input/output terminal 14, as indicated by the solid line 72 in FIG. 6. Thus, the DC measuring instrument 64 is driven (step S13). A potential (for example, 0.4 V) is applied between the main input/output terminal 12 and the sub input/output terminal 14. The controller 68 switches the control signals applied to the gate electrodes 20, 22, 24 and 26 of the transistors FET1, FET2, FET3 and FET4. The controller 68 controls the DC measuring instrument 46 to measure the current in order to test the conducting state of the switching circuit 50 (step S14). At step S14, the switching circuit 50 is tested by controlling the gate electrodes 20, 22, 24 and 26 so that the transistors FET1 and FET4 are in the conducting states, and the transistors FET2 and FET3 are in the cutoff states. Then, the switching circuit 50 is tested by controlling the gate electrodes 20, 22, 24 and 26 so that the transistors FET1 and FET4 are in the cutoff states, and the transistors FET2 and FET3 are in the conducting states. The above sequence makes it possible to test the conducting state between the main input/output terminal 12 and the sub input/output terminal 14.

Subsequently, the controller 68 controls the switch 70 to connect the DC signal source 62 and the DC measuring instrument 64 between the main input/output terminal 12 and the sub input/output terminal 14, as indicated by a broken line 74 (step S15). Thus, the DC measuring instrument 64 is driven. A potential (for example, 0.4 V) is applied between the main input/output terminal 12 and the sub input/output terminal 16. The controller 68 switches the control signals applied to the gate electrodes 20, 22, 24 and 26 of the transistors FET1, FET2, FET3 and FET4. The controller 68 controls the DC measuring instrument 46 to measure the current in order to test the conducting state of the switching circuit 50 (step S16). At step S16, which is similar to step S14, the switching circuit 50 is tested by controlling the gate electrodes 20, 22, 24 and 26 so that the transistors FET1 and FET4 are in the conducting states and the transistors FET2 and FET3 are in the cutoff states. Then, the switching circuit 50 is tested by controlling the gate electrodes 20, 22, 24 and 26 so that the transistors FET 1 and FET4 are in the cutoff states, and the transistors FET2 and FET3 are in the conducting states. The above sequence makes it possible to test the conducting state between the main input/output terminal 12 and the sub input/output terminal 16.

The controller 68 determines whether the current values measured at steps S14 and S16 are within the predetermined range, and judges whether the measurement result is normal (step S17). If it is judged that the measurement result is normal (Yes at step S17), the controller 68 judges that the switching circuit 50 is normal (step S18). If it is judged that the measurement result is not normal, the controller 68 judges that the switching circuit 50 is defective (step S19). Then, the operation test ends.

In the above configuration of the second embodiment, the test circuit the multiple input/output terminals including one main input/output terminal 12 and the sub input/output terminals 14 and 16. The transistors FET1 and FET3 of the first FETs are connected between the main input/output terminal 12 and the sub input/output terminal 14 and between the main input/output terminal 12 and the sub input/output terminal 16, respectively. The second embodiment may be varied so that only one first FET may be connected between the main input/output terminal 12 and one of the sub input/output terminals 14 and 16.

The above-described configuration of the second embodiment may be varied so that the drain and source electrodes FET1 through FET4 and FET8 through FET10 are interchanged.

The present invention is not limited to the specifically described embodiments and variations but may include other embodiments and variations without departing from the scope of the present invention.

What is claimed is:

1. A method for testing a switching circuit including a first FET connected between input/output terminals, a capacitor for cutting off a DC component connected between one of the input/output terminals and the first FET, and a second FET that is connected in parallel with the capacitor and has a gate electrode connected to a ground terminal, the method comprising:
   applying a potential that sets the second FET to a conducting state to the ground terminal; and
   applying a DC current to the first FET via a path that is formed by the second FET.

2. The method according to claim 1, wherein the second FET is in a cutoff state when a ground potential is applied to the gate electrode of the second FET.

3. The method according to claim 2, wherein the second FET is an FET of enhancement type.

4. The method according to claim 1, wherein:
   the input/output terminals include one main input/output terminal and multiple sub input/output terminals, and
   the first FET is connected between the main input/output terminal and one of the multiple sub input/output terminals.

5. A switching circuit comprising:
   a first FET connected between input/output terminals;
   a capacitor for cutting off a DC component connected between one of the input/output terminals and the first FET; and
   a second FET that is connected in parallel with the capacitor and has a gate electrode connected to a ground terminal,
   wherein the first FET is an FET of depletion type and second FET is an FET of enhancement type.

* * * * *